United States Patent [19]

Mazzuchelli et al.

[11] 4,159,295
[45] Jun. 26, 1979

[54] PROCESS FOR PRODUCING CERAMIC SUBSTRATES FOR ELECTRONIC CIRCUITS

[75] Inventors: Michael Mazzuchelli; Christian Stein, both of Munich; Manfred Wintzer, Unterpfaffenhofen, all of Fed. Rep. of Germany

[73] Assignee: Siemens Aktiengesellschaft, Berlin & Munich, Fed. Rep. of Germany

[21] Appl. No.: 911,752

[22] Filed: Jun. 2, 1978

[30] Foreign Application Priority Data

Jun. 16, 1977 [DE] Fed. Rep. of Germany ....... 2727364

[51] Int. Cl.² .................. C04B 33/32; C04B 35/64
[52] U.S. Cl. ............................... 264/63; 264/61; 264/66; 264/67; 264/148
[58] Field of Search .............. 264/67, 148, 101, 57, 264/63, 66, 61

[56] References Cited

U.S. PATENT DOCUMENTS

| | | | |
|---|---|---|---|
| 2,952,877 | 9/1960 | Park, Jr. | 264/63 |
| 2,966,719 | 1/1961 | Park, Jr. | 264/66 |
| 3,485,288 | 12/1969 | Zusman et al. | 264/56 |
| 3,943,216 | 3/1976 | Bakker | 264/56 |
| 4,009,238 | 2/1977 | Neidermeier | 264/63 |

*Primary Examiner*—Donald J. Arnold
*Attorney, Agent, or Firm*—Hill, Van Santen, Steadman, Chiara & Simpson

[57] ABSTRACT

A substantially homogeneous ceramic mass comprised of about 48 to 88 wt. % of alumina; about 4 to 12 wt. % of polyvinyl butyral; about 0.5 to 5 wt. % of polypropylene oxide - ethylene oxide block polymer; about 3 to 10 wt. % of a polymer solution comprised of acrylic acid esters, methacrylic acid esters and mixed polymers thereof; about 3 to 10 wt. % of a polyvalent alcohol and mixtures of such alcohols; about 1 to 5 wt. % of triethylene glycol and about 0.5 to 10 wt. % of water is produced and vacuum-extruded into an endless relatively flat strip, dried to a green state, shaped into a desired substrate shape and, if to be used with thin layer circuits, subjected to a plane-parallel pressure of about 9,000 to 12,000 N/cm² and then fired or sintered into rigid ceramic substrates.

11 Claims, 1 Drawing Figure

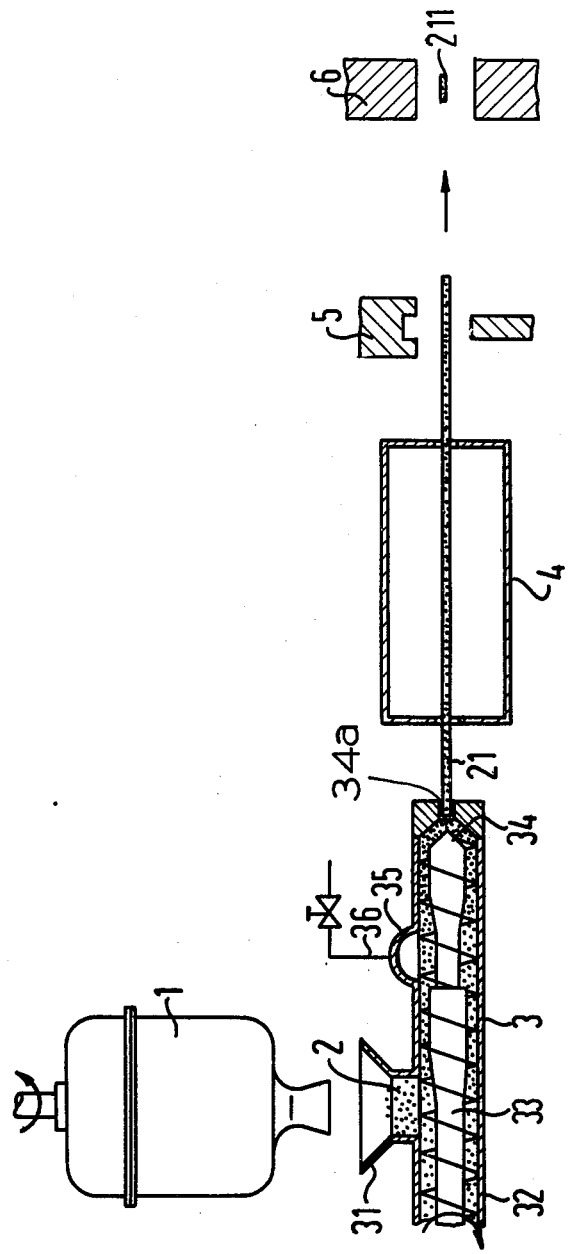

PROCESS FOR PRODUCING CERAMIC SUBSTRATES FOR ELECTRONIC CIRCUITS

BACKGROUND OF THE INVENTION

1. Field of the Invention

The invention relates to ceramic substrates for thin and thick layer electronic circuits and to the process for producing the same whereby a ceramic mass containing alumina, an organic bonding agent, a plasticizing agent, an emulsifier and water is transformed by extrusion into a cohesive, flat strip, which is then dried to a "green" state and divided or cut into desired components, which are then fired or sintered into solid ceramic substrates.

2. Prior Art

Because ceramic materials have outstanding insulating properties, they comprise a preferred material in the production of substrates for electronic circuits. Depending upon the intended utility, particular requirements are made as to the flatness and surface quality of such ceramic substrates. Thus, the surface roughness of a ceramic substrate to be used with thin film electronic circuits must be less than about 0.2 $\mu$m, since otherwise it is not possible to apply a continuous circuit component film in the thicknesses typically required for thin film component elements. On the other hand, where the ceramic substrates are to be used with thick film electronic circuits, the requirements regarding substrate surface quality are less strict since in thick film techniques, thicker circuit component layers are typically used for conductor paths, resistors, capacitors and the like. Further, an increased substrate surface may even be desirable with thick film electronic circuits in order to achieve improved adherence of the circuit component layers onto the substrate.

In order to achieve a high surface quality, ceramic substrates for use with thin film electronic circuits are generally produced in accordance with the so-called "foil casting" process as disclosed, for example, in U.S. Pat. No. 2,966,719. Generally, this foil casting process comprises preparing a slip or readily flowable or castable ceramic mass by mixing finely distributed ceramic materials, such as alumina, a volatile organic solvent, a wetting agent and an organic bonding agent which is soluble in the solvent utilized. A softener or lubricant which is compatible with the bonding agent may, optionally, also be added. This slip is then degassified and cast or poured onto a very smooth carrier consisting of, for example, glass. Then the solvent is removed, as by drying whereupon the cast slip assumes a tough, flexible leather-like "green" state which may be shaped as a strip or the like. This "green" strip is cut or divided, for example by punching, into desired substrate shape components, which are then transformed or cured into solid ceramic bodies by sintering or firing. Following the firing process, the surface roughness of such solid ceramic substrates amounts to less than about 0.2 $\mu$m. A disadvantage of this foil casting process comprises the relatively expensive preparation of the slip since a constant viscosity monitoring and expensive vacuum degassification process are required. Further, the initial drying process must be carried out relatively slowly in order to avoid cracks and the like and as a result of such slow drying, the quantity of ceramic substrates which can be produced per unit time is considerably limited. In addition, undesirable thickness variations tend to occur in such finished ceramic substrates due to fluctuations of viscosity in the slip.

A variation of the above-described foil casting process is disclosed in U.S. Pat. No. 4,009,938 (owned by the instant assignee) wherein the "green" dried shaped substrate components, prior to sintering, are compressed between two highly polished, plane-parallel surfaces. This relatively simple measure improves the flatness and surface quality of the ultimate ceramic substrates.

A process for producing ceramic substrates which is considerably simpler than the afore-described foil casting process and which is considerably cheaper is the so-called "extrusion process", which is disclosed, for example, in U.S. Pat. No. 2,952,877. Generally, this process comprises producing an extrudable ceramic mass comprised of, for example, alumina and bonding and plasticizing additives in a milling means to obtain a substantially homogeneous mixture, feeding such mixture to an extrusion means and extruding the mass through a slot-like nozzle within the extrusion means so as to form an endless flat strip, which is then dried relatively rapidly to the "green" state and stamped or divided into shaped articles which are then fired or sintered to form rigid bodies. The ceramic substrates produced in accordance with this extrusion process have a surface roughness (i.e. an average peak-to-valley height) of more than 0.5 $\mu$m so that as a practical matter said substrates can, at best be, only utilized with thick film circuits.

SUMMARY OF THE INVENTION

The invention provides ceramic substrates for thin and thick film layer electronic circuits and a process of producing the same whereby a substantially homogeneous extrudable ceramic mass comprised of about 48 to 88 wt. % of alumina; about 4 to 12 wt. % of polyvinyl butyral; about 0.5 to 5 wt. % of polyproplene oxide-ethylene oxide block polymer; about 3 to 10 wt. % of a polymer solution comprised of acrylic acid esters, methacrylic acid esters and mixed polymers thereof; about 3 to 10 wt. % of a polyvalent alcohol and mixtures of such alcohols; about 1 to 5 wt. % of triethylene glycol and about 0.5 to 10 wt. % of water is produced and vacuum-extruded into an endless relatively flat strip, dried to a green state, shaped into a desired substrate shape and, if to be used with thin layer circuits, subjected to a plane-parallel pressure of about 9,000 to 12,000 N/cm$^2$ and then fired or sintered into rigid ceramic substrates. Depending on the quality of the extrusion nozzle used during the vacuum extrusion process, the green unfired and unpressed ceramic strip produced from the above material has an average peak-to-valley height ranging between about 0.5 and 1 $\mu$m and is thus suitable for use with thick layer circuits. However, since the green unpressed ceramic strips of the invention have a rubber-like property, i.e. flexible and elastic, their surface quality can be considerably improved before sintering by simply subjecting such surfaces to pressure. Of course, surface quality is also considerably improved by proper selection of the ceramic mass components whereby the polyvinyl butyral and polymer solutions function as bonding and plasticizing agents, the polypropylene oxide-ethylene oxide block polymers function as an emulsifier, the polyvalent alcohols or mixtures of such alcohols function as a solvent, the triethylene glycol functions as a lubricant for the extrusion process and the water acts as a plasticizing agent.

The special material properties of the dried and unsintered ceramic strip produced in accordance with the principles of the invention are within the limits prescribed for the individual components of the ceramic mass. Further, in order to achieve the optimally desired properties in respect to surface quality, it is preferable to form a substantially homogeneous extrudable ceramic mass consisting essentially of 76 to 84 wt. % of alumina; 6 to 8 wt. % of polyvinyl butyral; 0.7 to 0.9 wt. % of polypropylene oxide-ethylene oxide block polymer; 3 to 4 wt. % of a polymer solution consisting essentially of acrylic acid esters, methacrylic acid esters and mixed polymers thereof; 5 to 7 wt. % of a polyvinyl alcohol or a mixture of polyvinyl alcohols; 1 to 1.4 wt. % of triethylene glycol and 1 to 2 wt. % of water.

The polymer solutions used in the production of the extrudable ceramic masses of the invention comprise, for example, approximately a 50% solution of liquid acrylic resins, such as normally used for lacquering purposes. In selecting the polymer solution, it should be bore in mind that the solvent used therein must be compatible with the other components of the ceramic masses. Particularly good results are achieved if an aromatic/butanol mixture is used as a solvent for the polymer solution. In this instance, an approximately 50% polymer solution is preferably utilized.

The polyvinyl alcohols used in the production of the extrudable ceramic mass of the invention may comprise a polyether polyol or a mixture of polyether polyols.

Preferably, in the production of the extrudable ceramic mass of the invention, alumina having a minimum particle or granule size of about 1 μm is utilized. With such maximum particle size, a particularly high surface quality on the sintered ceramic substrates is achieved.

In a preferred embodiment of the invention, the homogeneous extrudable ceramic mass is transformed into a flat strip by vacuum extrusion. An advantage of such process is that the required degassification of the ceramic mass may be carried out at a relatively low cost within a suitable extrusion means.

Advantageously, the extruded flat strip is dried to a green state at a temperature ranging from about 80° C. to 90° C. over a period of time ranging from about 5 to 10 hours since such drying conditions safely eliminate the formation of cracks and the like.

In instances where the ultimate ceramic substrates are to be used with thin layer circuits, as already mentioned, the surface quality of such substrates must be considerably improved prior to sintering. Such surface improvement may be achieved, for example, by transporting the unsintered strip through a nip defined by two spaced apart rollers having highly polished surfaces which exert a pressure on the strip. However, while this serves to improve the surface smoothness, it also results in a certain undulation within the strip so that it is preferable to compress the shaped components between highly polished, plane-parallel surfaces at a pressure ranging between about 9,000 and 12,000 N/cm². This compression results in a reduction of the surface roughness and substantially simultaneously provides an outstanding flatness to the ceramic substrates, which is not lost during the subsequent sintering or firing process. During the compression of the shaped substrates, the pressure is preferably maintained for a period of time ranging from about 1 to 5 minutes.

In preferred exemplary embodiments of the invention the shaped green substrate bodies (whether pressed or not) are sintered at a temperature ranging between about 1480° C. to 1570° C. for a period of time ranging between about 2 to 5 hours. Under such sintering conditions, deformation of the substrates is safely avoided and at the same time particularly favorable surface roughness values (i.e. smoothness) are attained.

BRIEF DESCRIPTION OF THE DRAWINGS

The FIGURE comprises an elevated cross-sectional and somewhat schematic view of an apparatus useful in producing ceramic substrate in accordance with the principles of the invention.

As shown in the drawings, a select amount of finely ground aluminum and the various additives described above, are placed within a milling or mixing means 1 and are there mixed or converted into a substantially homogeneous extrudable ceramic mass 2. The mixing or milling means 1 has a controllable means for feeding the mass into a feed funnel 31 of a vacuum extrusion means 3. Within the cylindrical compression means 32 of the vacuum extruder means 3, the mass 2 is pushed forward, as by a worm-gear shaft 33 mounted at one end of extrusion means 3 and expelled by a compression head 34 at the other end of the extrusion means 3 through a nozzle 34a having slot-like cross-section so as to form an endless flat ceramic strip 21. In order to degassify the mass 2, the vacuum extrusion means 3 is provided with a chamber or dome 35 operationally connected via conduit 36 to a vacuum pump (not shown). After emerging from the slot 34a, the strip 21 is dried within a suitable drying chamber so as to assume a rubber or elastic-like "green" state. This drying process may be carried out discontinuously or, as in the exemplary embodiment illustrated, continuously, employing a through-flow furnace means 4. After green drying, the strip 21 may then be cut or divided up as by a punching tool 5, into individually shaped bodies 211, whose dimensions are selected to take into account the shrinkage which may occur during sintering. The shaped components or bodies 211 may then be sintered or fired and utilized as ceramic substrates with thick film circuits. In instances where such ceramic substrates are to be utilized with thin film circuits, the molded bodies 211 must be compressed between highly polished and plane-parallel surfaces of a press means 6, prior to sintering. The sintering or firing of the molded components 211 may be carried out in a known manner, for example, in a tunnel furnace means (not shown).

With the foregoing general discussion in mind, there is now presented detailed examples which will illustrate to those skilled in the art the manner in which the invention is carried out. However, the examples are not to be construed as limiting the scope of the invention in any way.

EXAMPLE 1

A homogeneous ceramic paste was prepared in a milling means by adding the following components thereto:
  (a) 79.7 wt. % alumina ($Al_2O_3$) having an average particle size of about 1 μm (for example available under the Trademark "Alcoa XA16" from the Aluminum Corporation, U.S.A.)
  (b) 7.2 wt. % polyvinyl butyral (for example available under the Trademark "Butvar BR" from the Monsanto Chemical Corporation, St. Louis, Missouri, U.S.A.)
  (c) 0.8 wt. % propylene oxide-ethylene oxide block polymer (for example available under the Trademark "Pluriol PE 6400" from the BASF, Ludwigshafen, West Germany)

(d) 3.6 wt. % a 50% polymer solution consisting of acrylic acid dissolved in an aromatic-butanol mixture (for example available under the Trademark "Plexisol BV 586" from Rohm und Haas, Darmstadt, West Germany)

(e) 6 wt. % polyether polyol having an OH value of 420 and a functionality of 3 (for example available under the Trademark "RM 166" from Upjohn Polymer, Texas, U.S.A. or under the Trademark "Pluracol 3130" from BASF-Wyandotte, Michigan, U.S.A.)

(f) 1.2 wt. % triethylene glycol (g) 1.6 wt. % water

The above-described 50% polymer solution comprised of acrylic resin is dissolved in a mixture of an aromatic solvent having a high boiling point (for example available under the Trademark "Shellsol A" from Deutsche Shell-AG, Hamburg, West Germany) and butanol. The aromatic solvent comprises a solution of 70% trimethylbenzene.

The so-attained homogeneous ceramic paste was then fed into a vacuum extrusion press means and extruded through the compression head thereof in the form of a cohesive strip having a thickness of approximately 1 mm and a width of approximately 140 mm. The vacuum extrusion was carried out at an operating temperature of about 20° C. and at a vacuum of approximately 0.1 bar so as to degassify the mass. Following the vacuum extrusion, the strip was dried for approximately 5 hours at a temperature ranging between 80° C. and 90° C. During this crack-free drying process, water and at least a part of the aromatic/butanol mixture was evaporated. Following the drying, the strip was cut by a suitable punching tool into shaped bodies having a size of approximately 135 mm×135 mm. At this time, such shaped bodies had a surface quality characterized by an average peak-to-valley height of 0.5 μm. These shaped bodies were then sintered, i.e. fired, in a tunnel furnace for a period of about 3 hours at a temperature ranging between about 1500° C. and 1550° C. without notable deformation.

After the sintering process, the finished ceramic bodies possessed surface qualities characterized by an average peak-to-valley height of between 0.4 and 0.5 μm and were thus eminently suitable for use as ceramic substrates with thick film circuits.

EXAMPLE 2

A homogeneous ceramic mass was prepared from a composition mixture substantially identical with that set forth in Example 1 and transformed by vacuum extrusion into a flat strip, whereupon the flat strip was dried and cut into individual shaped bodies, all substantially as described in Example 1. However, in contrast to Example 1, the shaped bodies were then, prior to sintering, subjected to a pressure of approximately 10,000 N/cm² between highly polished plane-parallel surfaces of a press means for approximately 1 to 5 minutes. As a result of this compression process, the flatness of the shaped components was considerably improved and the average peak-to-valley height on such surfaces was reduced from 0.4 μm to values of below 0.2 μm. Following the sintering process, the finished ceramic substrates had an average peak-to-valley height of less than 0.15 μm and were thus eminently suitable for use as ceramic substrates with thin film circuits.

Although the above invention was described by reference to particularly illustrative embodiments thereof, many changes and modifications of such invention may become apparent to those skilled in the art without departing from the spirit and scope of the invention. Therefor it is intended to include within the patent warranted hereon all such changes and modifications as may reasonably and properly be included within the scope of the invention's contribution to the art.

We claim as our invention:

1. In a process for producing a ceramic substrate wherein a substantially homogeneous extrudable ceramic mass comprised of aluminum, an organic bonding agent, a plasticizing agent, an emulsifying agent and water is transformed by extrusion into a cohesive flat strip, the strip is green dried and cut into desired size bodies which are then sintered, the improvement comprising wherein said ceramic mass consists essentially of about 48 to 88 wt. % of alumina; about 4 to 12 wt. % of polyvinyl butyral; about 0.5 to 5 wt. % of polypropylene oxide-ethylene oxide block polymer; about 3 to 10 wt. % of a polymer solution containing a polymer selected from a group consisting of acrylic acid esters, methacrylic acid esters and mixed polymers thereof; about 3 to 10 wt. % of an alcohol selected from a group consisting of a polyvalent alcohol and mixtures of polyvalent alcohols; and about 1 to 5 wt. % of triethylene glycol and about 0.5 to 10 wt. % of water.

2. In a process as defined in claim 1 wherein said ceramic mass consists essentially of about 76 to 84 wt. % of alumina; about 6 to 8 wt. % of polyvinyl butyral; about 0.7 to 0.9 wt. % of polypropylene oxide-ethylene oxide block polymer; about 3 to 4 wt. % of a polymer solution containing a polymer selected from a group consisting of acrylic acid esters, methacrylic acid esters and mixed polymers thereof; about 5 to 7 wt. % of an alcohol selected from a group consisting of a polyvalent alcohol and mixtures of polyvalent alcohols; about 1 to 1.4 wt. % of triethylene glycol and about 1 to 2 wt. % of water.

3. In a process as defined in claim 1 wherein said polymer solution contains a solvent comprised of an aromatic/butanol mixture.

4. A process as defined in claim 3 wherein said polymer solution comprises about a 50% polymer solution.

5. A process as defined in claim 1 wherein said alcohol is selected from the group consisting of polyether polyol and mixtures of polyether polyols.

6. In a process as defined in claim 1 wherein said ceramic mass contains alumina having an average maximum particle size of about 1 μm.

7. In a process as defined in claim 1 wherein said ceramic mass is transformed into said flat strip via vacuum extrusion.

8. In a process as defined in claim 1 wherein said strip is green dried at a temperature ranging between about 80° C. to 90° C. over a period of time ranging between about 5 to 10 hours.

9. In a process as defined in claim 1 wherein said bodies, prior to sintering, are subjected to a pressure ranging between about 9,000 and 12,000 N/cm² between highly polished plane-parallel surfaces.

10. In a process as defined in claim 9 wherein said pressure is maintained for a period of time ranging between about 1 to 5 minutes.

11. In a process as defined in claim 1 wherein said bodies are sintered at a temperature ranging between about 1480° C. to 1570° C. over a period of time ranging between about 2 to 5 hours.

* * * * *